(12) United States Patent
Kim et al.

(10) Patent No.: US 12,131,887 B2
(45) Date of Patent: Oct. 29, 2024

(54) PLASMA PROCESSING SYSTEM AND METHOD USING RADIO FREQUENCY AND MICROWAVE POWER

(71) Applicant: Tokyo Electron Limited, Tokyo (JP)

(72) Inventors: Yunho Kim, Cohes, NY (US); Yanxiang Shi, Clifton Park, NY (US); Mingmei Wang, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 453 days.

(21) Appl. No.: 17/307,654

(22) Filed: May 4, 2021

(65) Prior Publication Data

US 2022/0246402 A1    Aug. 4, 2022

Related U.S. Application Data

(60) Provisional application No. 63/145,048, filed on Feb. 3, 2021.

(51) Int. Cl.
*H01J 37/32* (2006.01)
*H01J 37/18* (2006.01)
*H01L 21/67* (2006.01)

(52) U.S. Cl.
CPC ........ *H01J 37/32266* (2013.01); *H01J 37/18* (2013.01); *H01J 37/32091* (2013.01); *H01J 37/3211* (2013.01); *H01J 37/32119* (2013.01); *H01J 37/3222* (2013.01); *H01J 37/32229* (2013.01); *H01J 37/32715* (2013.01); *H01J 2237/327* (2013.01); *H01J 2237/334* (2013.01); *H01L 21/67069* (2013.01)

(58) Field of Classification Search
None
See application file for complete search history.

(56) References Cited

U.S. PATENT DOCUMENTS

| | | | |
|---|---|---|---|
| 2003/0024900 A1* | 2/2003 | Johnson | H01J 37/32568 118/712 |
| 2003/0060054 A1* | 3/2003 | Takahashi | H01J 37/32834 216/72 |

(Continued)

FOREIGN PATENT DOCUMENTS

| | | |
|---|---|---|
| JP | 2006128000 A | 5/2006 |
| KR | 20110020723 A | 3/2011 |

OTHER PUBLICATIONS https://en.wikipedia.org/wiki/Electromagnetic_metasurface (Year: 2024).*

(Continued)

*Primary Examiner* — Feifei Yeung Lopez
(74) *Attorney, Agent, or Firm* — Slater Matsil, LLP

(57) ABSTRACT

A plasma processing system includes a vacuum system, a plasma processing chamber including a chamber cavity coupled to the vacuum system, a substrate holder including a surface inside the chamber cavity, a radio frequency (RF) source electrode coupled to an RF power source, the RF source electrode configured to ignite plasma in the chamber cavity. The system includes microwave source coupled to a microwave oscillator, and an electromagnetic (EM) metasurface, where the EM metasurface having a major surface electromagnetically coupled to the microwave source, the major surface configured to couple microwave power to the plasma in the chamber cavity.

22 Claims, 11 Drawing Sheets

(56) References Cited

U.S. PATENT DOCUMENTS

| | | | |
|---|---|---|---|
| 2006/0065195 A1 | 3/2006 | Nagatsu | |
| 2006/0090704 A1 | 5/2006 | Ide | |
| 2006/0216940 A1* | 9/2006 | Gorrell | H01S 3/0903 |
| | | | 257/E21.314 |
| 2008/0099447 A1 | 5/2008 | Ando | |
| 2011/0253313 A1* | 10/2011 | Suzuki | H01J 37/32532 |
| | | | 156/345.46 |
| 2013/0240482 A1* | 9/2013 | Nam | H01J 37/32183 |
| | | | 156/345.24 |
| 2014/0038431 A1* | 2/2014 | Stowell | H01L 21/67115 |
| | | | 438/795 |
| 2016/0284516 A1 | 9/2016 | Ikeda | |
| 2020/0090898 A1 | 3/2020 | Vandermeulen | |

OTHER PUBLICATIONS

Erementchouk, Mikhail, "Electrodynamics of spoof plasmons in periodically corrugated waveguides," 472, http://dx.doi.org/10.1098/rspa.2016.0616, Department of Electrical Engineering and Computer Science, Oct. 2016, Proceedings R. Society, A, 21 pages.

Humboldt University Berlin, https://www.physik.hu-berlin.de/de/nano/lehre/Gastvorlesung%20Wien/plasmonics, Chapter 7, "Plasmonics," downloaded Mar. 13, 2021, 32 pages.

Kim, Yunho, et al., "Surface plasma discharge generated by spoof surface plasmon polariton excitation: a computational modeling study," 2019 Journal of Physics D: Applied Physics 52, 445203, 19 pages.

Lee, Min Kyung, et al., "Add-on unidirectional elastic metamaterial plate cloak," Scientific Reports, www.nature.com/scientificreports.com, Feb. 10, 2016, 10 pages.

Maier, Stefan Alexander, "Plasmonics: Fundamentals and Applications," Centre for Photonics and Photonic Materials, Department of Physics, University of Bath, UK, May 16, 2007, 214 pages.

Photonics Laboratory, "Surface plasmons," Chapter 12, https://www.photonics.ethz.ch/fileadmin/user_upload/Courses/NanoOptics/plasmonss.pdf, Nov. 19, 2014, 44 pages.

Singh, Pramod K., et al., "Metamaterials for Remote Generation of Spatially Controllable Two Dimensional Array of Microplasma," Scientific Reports, www.nature.com/scientificreports.com, Aug. 7, 2014, 5 pages.

International Search Report and Written Opinion, PCT Application No. PCT/US2022/014535, mailed May 16, 2022, 10 pages.

International Search Report and Written Opinion, PCT Application No. PCT/US2022/014537, mailed May 16, 2022, 9 pages.

* cited by examiner

(12) United States Patent
US 12,131,887 B2

PLASMA PROCESSING SYSTEM AND METHOD USING RADIO FREQUENCY AND MICROWAVE POWER

CROSS-REFERENCE TO RELATED APPLICATIONS

This application claims the benefit of U.S. Provisional Application No. 63/145,048, filed on Feb. 3, 2021, which application is hereby incorporated herein by reference.

TECHNICAL FIELD

The present invention relates generally to a system and method for plasma processes, and, in particular embodiments, to a system and method for plasma processing of a semiconductor wafer using radio frequency (RF) and microwave power.

BACKGROUND

Generally, a semiconductor device, such as an integrated circuit (IC) is fabricated by sequentially depositing and patterning layers of dielectric, conductive, and semiconductor materials over a substrate to form a network of electronic components and interconnect elements (e.g., transistors, resistors, capacitors, metal lines, contacts, and vias) integrated in a monolithic structure. Many of the processing steps used to form the constituent structures of semiconductor devices are performed using plasma processing techniques, including sputtering, reactive ion etching (RIE), plasma-enhanced chemical vapor deposition (PECVD), and plasma-enhanced atomic layer etch (PEALE) and atomic layer deposition (PEALD).

At each successive technology node, the minimum feature sizes have been shrunk to reduce cost by roughly doubling the component packing density. Innovations in patterning such as immersion photolithography, multiple patterning, and 13.5 nm wavelength extreme ultraviolet (EUV) optical systems have reduced critical feature sizes to about ten nanometers. Concurrently, unconventional materials such as organics, ferroelectrics, and chalcogenides are being increasingly used in products. This scenario poses a challenge for plasma technology to provide platforms for patterning features with accurate sizing, precise placement, and tight control, often at atomic scale dimensions. Meeting this challenge along with the uniformity and repeatability requirements for high volume IC manufacturing needs further innovation.

SUMMARY

A plasma processing system includes a vacuum system, a plasma processing chamber including a chamber cavity coupled to the vacuum system, a substrate holder including a surface inside the chamber cavity, a radio frequency (RF) source electrode coupled to an RF power source, the RF source electrode configured to ignite plasma in the chamber cavity. The system includes microwave source coupled to a microwave oscillator, and an electromagnetic (EM) metasurface, where the EM metasurface having a major surface electromagnetically coupled to the microwave source, the major surface configured to couple microwave power to the plasma in the chamber cavity.

A plasma processing system including: a plasma processing chamber; a radio frequency (RF) source electrode coupled to an RF power source, the RF source electrode configured to ignite plasma in the plasma processing chamber; a microwave power system coupled to the plasma with microwave power, the microwave power system including: an electromagnetic (EM) metasurface having a major surface configured to couple microwave power to the plasma in the plasma processing chamber; a microwave source coupled to a microwave oscillator; and a controller configured to execute instructions to adjust a spatial uniformity metric of EM power supplied to the plasma.

A method for plasma processing of a semiconductor wafer, the method including: loading the semiconductor wafer in a plasma processing chamber coupled to a radio frequency (RF) source electrode and a microwave power system including a microwave oscillator and a microwave source; igniting plasma by coupling RF power from the RF source electrode to gas in the plasma processing chamber; coupling microwave power from the microwave power system to a plasma ignited in the plasma processing chamber by coupling the microwave oscillator to the microwave source; and adjusting the microwave power to control a spatial uniformity metric of a combined electromagnetic (EM) power being supplied to the plasma.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1A:
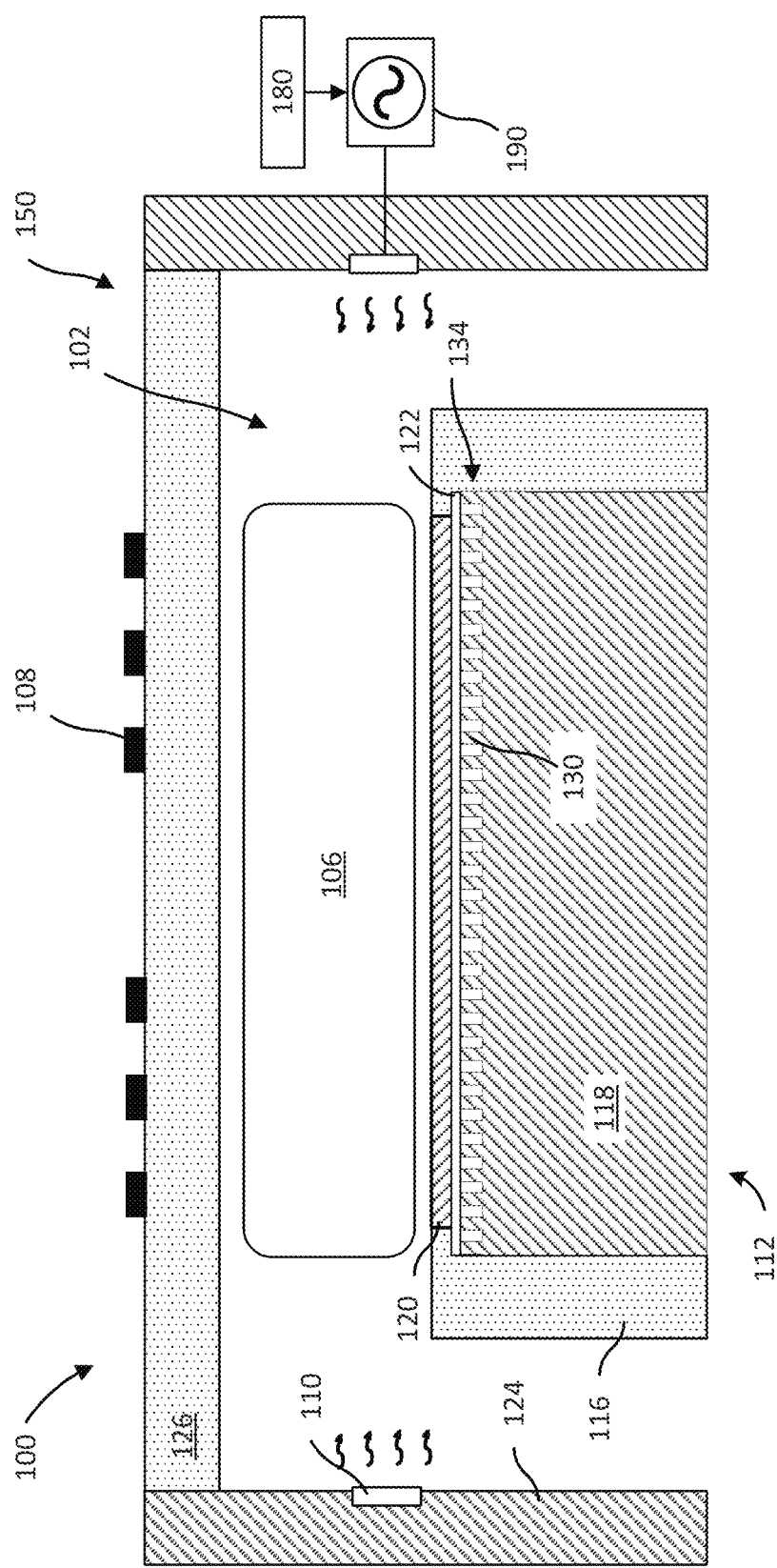
FIG. 1A is a cross-sectional view of an inductively coupled plasma (ICP) processing chamber with an electromagnetic (EM) metasurface in a substrate holder of the ICP chamber, in accordance with an embodiment.

This disclosure describes embodiments of plasma processing systems and methods for processing a semiconductor wafer, where radio frequency (RF) power is supplemented with microwave power in a total electromagnetic (EM) power applied to ignite, sustain, and control plasma in a plasma processing chamber. The spatial distribution of microwave power coupled to plasma may be different from, and complementary to, the spatial distribution of RF power coupled to plasma. It is desirable to have a spatially uniform distribution of combined EM power coupled to the plasma. In the example embodiments, plasma may be ignited and sustained using power from an RF power source, while a microwave power system providing microwave power from a microwave source is used to adjust a spatial distribution of the total electromagnetic (EM) power supplied to the plasma. The adjustment may improve a spatial uniformity metric of the total EM power supplied to the plasma. By utilizing two independent sources of EM power, the systems and methods illustrated by example embodiments in this disclosure provide an advantage of achieving more uniform plasma and, hence, more spatially uniform characteristics for the processed semiconductor wafer.

The adjustment to the EM power distribution is effected from outside the plasma processing chamber using a controller for the microwave power system to control the microwave power, as described in further detail below. Accordingly, the embodiments provide an advantage of having a plasma control parameter that may be used to adjust the distribution of EM power. A specific control parameter value may be selected for a particular plasma process recipe, and/or a specific set of values may be selected for a particular cyclic or multi-step plasma process recipe, for example, for multi-step plasma etching. The control parameter values may be selected by a process control system as part of a feedback or feed forward control in a process flow for semiconductor device fabrication.

In the embodiments described in this disclosure, stationary surface EM waves in the microwave frequency band are excited on an EM metasurface placed in proximity of plasma inside the processing chamber in order to couple microwave power from a microwave source to plasma. In general, an EM metasurface refers to a repetitive two-dimensional (2D) arrangement of a pattern of conductor and insulator having sub-wavelength features. Incident EM radiation at or near a resonant frequency of the repeating unit of the 2D arrangement may excite surface EM waves. One example of an EM metasurface is a corrugated metal surface, which is an array of trench-shaped openings etched in a metal layer. When a quarter wavelength of an impinging EM radiation is substantially close to the depth of the corrugations, EM excitations propagating along the metal to dielectric interface in a direction perpendicular to the corrugations are observed. Such surface EM excitations are sometimes referred to as spoof surface plasmon polariton.

A surface plasmon polariton (SPP) is an EM surface wave at the interface between a dielectric and a conductor excited via coupling of EM fields to electron plasma in metal using suitably designed couplers. Surface electromagnetic field oscillations on the dielectric side and plasma oscillations of free electrons on the metal side propagate confined to the interface with evanescent fields having subwavelength decay lengths perpendicular to the direction of the wave. Ordinarily, the oscillation frequency of SPP is high (e.g., $10^{14}$ Hz to $10^{15}$ Hz) because, at lower frequencies (e.g., $<10^{13}$ Hz), most metals behave as ideal conductors, which implies that the frequency-dependent complex dielectric constant has a real part equal to zero. Nevertheless, artificial SPP modes in the microwave range (e.g., $10^9$ Hz to $10^{11}$ Hz) have been demonstrated using EM metasurfaces that mimic the dispersion characteristics and field confinement of natural SPP; hence referred to as spoof surface plasmon polariton (SSPP).

In the embodiments described in this disclosure, the microwave power system comprises the microwave source coupled to a microwave oscillator and the EM metasurface. The EM metasurface has a major surface configured to receive microwave power from the microwave source and couple microwave power to plasma. Surface EM excitations, similar to the SSPP excitations described above, are generated between two conductive regions: the EM metasurface and the high electron density, charge-neutral region of the plasma. The dielectric between these two conductors includes the plasma sheath, which is a peripheral space-charge region of confined plasma that is depleted of mobile electrons. As described in further detail below, EM metasurfaces may be of various patterns and arrangements in various embodiments.

FIG. 1A illustrates an example embodiment of a plasma processing system 100 comprising a plasma processing chamber 150 comprising a substrate holder 112. In FIG. 1A, the plasma processing chamber 150 is an inductively coupled plasma (ICP) processing chamber shown in a cross-sectional view. An RF source electrode 108, shaped like a planar coil disposed over a top cover comprising a dielectric window 126, is the RF source providing RF power to ignite and sustain plasma 106. The dielectric window 126 may comprise, for example, a ceramic such as quartz.

The microwave source of the plasma processing system wo is microwave antennas no shown placed on the sidewall 124 of the plasma processing chamber 150. In this example embodiment, the sidewall 124 may comprise a conductive material, for example, aluminum or stainless steel coated with yttria. The microwave antennas no are configured to radiate EM waves inside the plasma processing chamber 150 in a bandwidth, $\Delta f$, around a center frequency, $f_c$. The center frequency is selected to be in the microwave range, and the bandwidth, $\Delta f$, may be about ±5% to about ±15% of $f_c$. The radiation emitted from the antenna no would have the same frequency as the output signal of the microwave oscillator 190 coupled to the antenna no. In the embodiments in this disclosure, the microwave oscillator 190 may be a tunable microwave oscillator 190, the frequency being adjusted in the range $f_c \pm \Delta f/2$ using a tuner. Microwave frequencies suitable for plasma processing may be from about 1 GHz to about 100 GHz in various embodiments and 2.45 GHz in one embodiment.

As illustrated in FIG. 1A, loaded on the substrate holder 112 is a semiconductor wafer 120 exposed to the ambient inside chamber cavity 102. The substrate holder 112 is generally an electrostatic chuck comprising a conductive pedestal, such as the conductive pedestal 118. A top region of the pedestal 118 comprises an EM metasurface 134, where a major surface 130 of the EM metasurface 134 is a top surface of the pedestal 118 (the surface facing the chamber cavity 102). The major surface 130 is electromagnetically coupled to the antennas no, such that a portion of the radiated microwave power may be received by the major surface 130 to excite the EM surface wave or SSPP. In some embodiments, the pedestal 118 and the major surface 130 of the EM metasurface 134 comprise the same conductor (e.g., copper, aluminum, tungsten, or brass) while, in other embodiments, they may not comprise the same conductor. In FIG. 1A, the EM metasurface 134 and the pedestal 118 form one monolithic structure. However, it is understood that separate structures assembled together are also possible.

In the example embodiment illustrated in FIG. 1A, the major surface 130 of the EM metasurface 134 comprises openings formed in the pedestal 118 in a pattern described in further detail below with reference to FIGS. 1B and 1C. The openings may be filled with insulating gas (e.g., air or nitrogen) that may be sealed in the openings by a separator 122 comprising a solid dielectric layer covering the major surface 130 of the EM metasurface 134. This allows the insulating gas in the openings to be at a much higher pressure (e.g., atmospheric pressure) than the pressure in the chamber cavity 102, thereby help prevent occurrence of accidental arcing, likely in low pressure gas exposed to high electric fields. Suitable materials for the separator 122 include quartz, alumina and glass. The sides of the pedestal 118 are covered by an optional dielectric structure 116.

It is noted that the conductive pedestal 118 may be configured to additionally function as an RF bias electrode, a DC bias electrode, or ground connection, or a combination of a DC bias electrode and RF bias electrode.

Figure 1B:
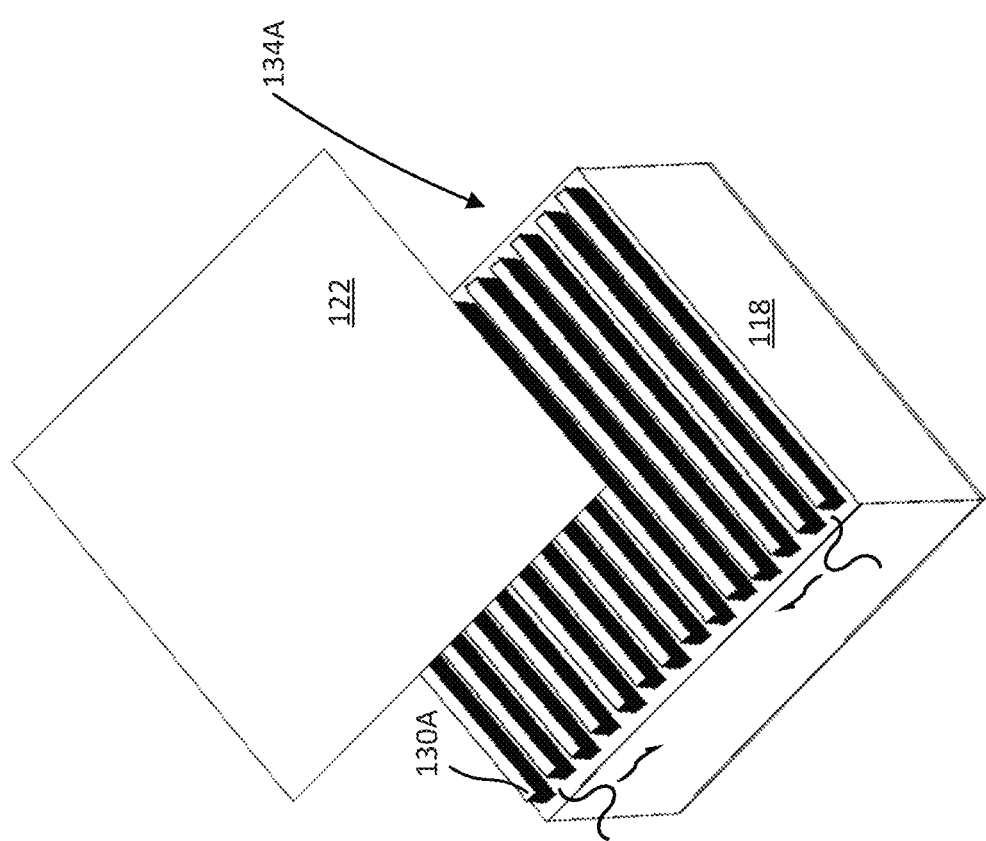
FIG. 1B is a perspective view of an EM metasurface, in accordance with an embodiment.
Figure 1C:
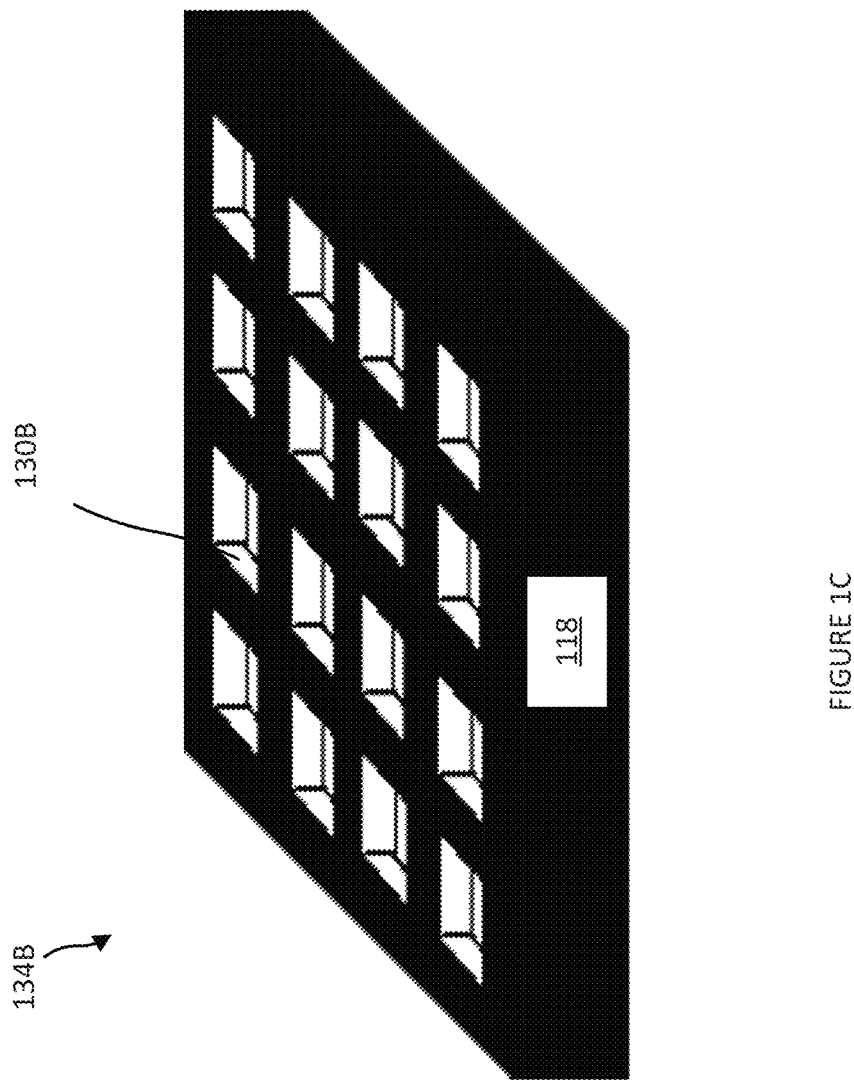
FIG. 1C is a perspective view of an EM metasurface, in accordance with an embodiment.

FIGS. 1B and 1C illustrate perspective views of two example EM metasurfaces 134A and 134B that may be used in the plasma processing system wo shown in FIG. 1A. The EM metasurfaces in FIGS. 1B and 1C may be the pedestal 118 of the substrate holder 112, described with reference to FIG. 1A. Either of the major surfaces 130A (in FIG. 1B) and 130B (in FIG. 1C) may be the major surface 130 of the EM metasurface 134 illustrated in FIG. 1A. As mentioned above, the EM metasurface and the pedestal 118 form one monolithic structure whose top surface is the major surface 130 of the EM metasurface 134. The pedestal 118 serves as a conductive base on the top surface of which an array of openings has been patterned.

In FIG. 1B, the major surface 130A comprises an array of long and narrow parallel trenches, each having a top opening shaped like a rectangle. The array is, accordingly, a line and space pattern formed of conductive lines spaced by a gas insulator. The conductive walls of each trench are roughly vertical sidewalls terminating in a roughly flat bottom wall. All the trenches in the array have roughly equal depth. The separator 122 that covers the major surface 130 in FIG. 1A is shown above the major surface 130A in the exploded view illustrated in FIG. 1B.

The major surface 130B, illustrated in FIG. 1C, comprises a rectangular array of holes shaped like a prism, each having a top opening shaped like a square. The conductive sides of the prism-shaped holes are roughly vertical and the bottom is a flat conductive surface. In the example illustrated in FIG. 1C, the openings are shaped like square prisms. However, it is understood that prisms having other shapes such as cylinder and pyramid may be used. In some embodiments, curved corrugations may be used instead of prism-shaped corrugations having planar sides with edges.

Although referred to as a surface wave, the electromagnetic field of the SSPP excitation exists in the dielectric region of the major surfaces 130A/130B as well as the dielectric region between the major surfaces 130A/130B and the plasma 106 (illustrated in FIG. 1A). Accordingly, the major surfaces 130A and 130B include the conductive sidewalls of the hollow openings, in addition to the conductive surface covered by the separator 122 on the side that faces the chamber cavity 102 (see FIG. 1A).

The feature sizes of the patterned major surfaces 130A and 130B of the EM metasurfaces illustrated in FIGS. 1B and 1C determine the resonant modes for the structures. As mentioned above, incident EM radiation at a resonant frequency may excite the respective SSPP mode in the major surface of an EM metasurface. As indicated by wavy symbols with arrows in FIG. 1B, microwave radiation may be coupled to the EM metasurface 134A at the edges of the major surface 130A, and the SSPP mode thereby excited may propagate microwave power from the edges toward a central region of the major surface 130A. One condition for resonance for the major surfaces 130A and 130B is that the openings have depth, d, substantially close to $\lambda/4$, where $\lambda$ is the wavelength of the incident EM radiation. The $d=\lambda/4$ condition implies that for the range of microwave frequencies mentioned above, 1 GHz$<f_c<$100 GHz, the depth of the openings in the major surfaces 130A and 130B would have to be in the range 7.5 cm$<d<$0.75 mm. Generally, the sizes of various features on the EM metasurfaces, used in various embodiments of plasma processing systems described in this disclosure, may be from about 1 mm to about 10 cm.

Figure 2A:
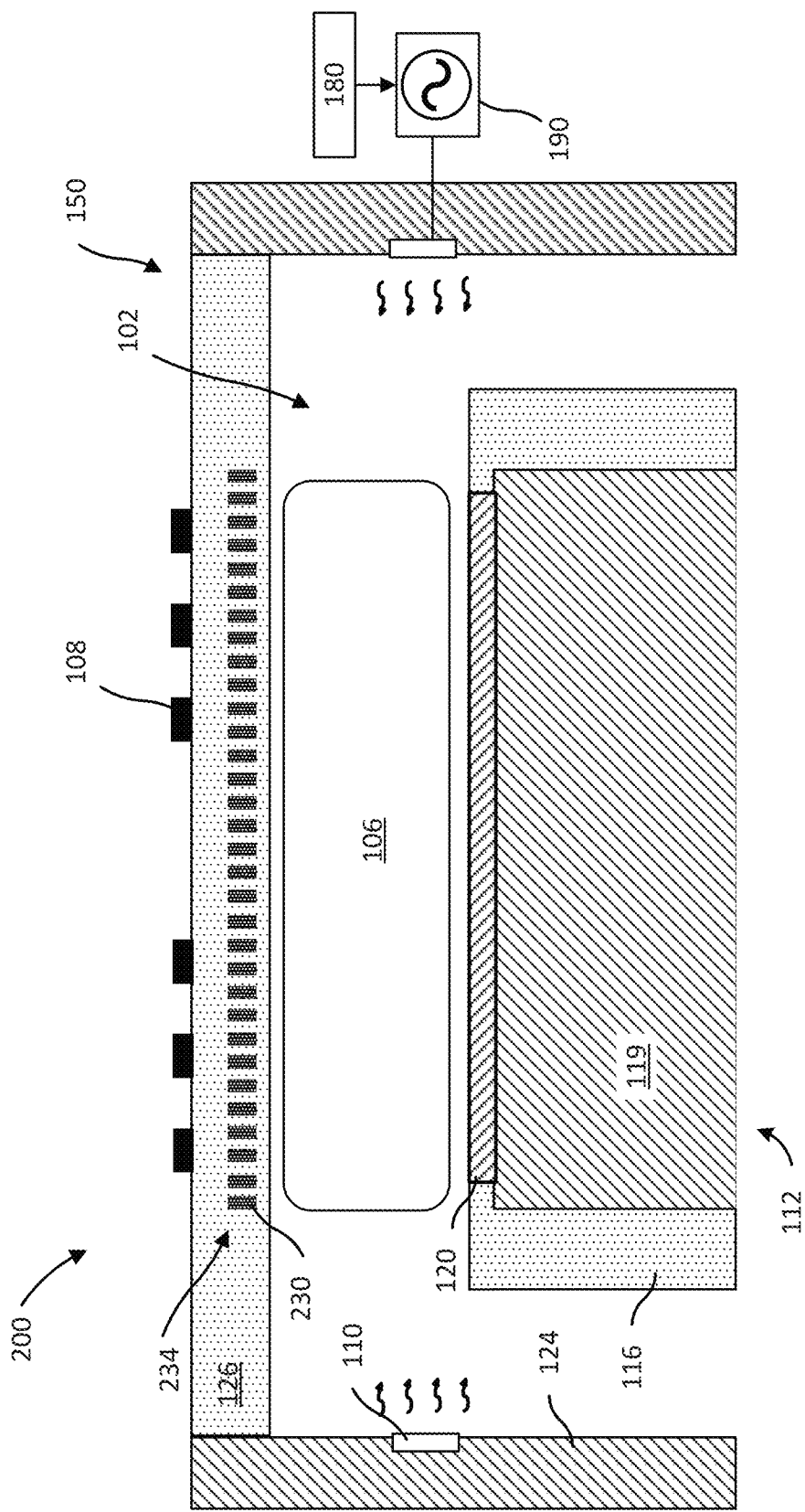
FIG. 2A is a cross-sectional view of an ICP processing chamber with an EM metasurface in a top cover of the ICP chamber, in accordance with an embodiment.

FIG. 2A illustrates a cross-sectional view of another plasma processing system 200 that uses both RF power and microwave power to process the semiconductor wafer 120 in a plasma processing chamber 150 configured as an ICP chamber. Similar to the plasma processing system 100, described above with reference to FIG. 1A, the RF source electrode 108 is disposed over the dielectric window 126, and the microwave source is the microwave antennas no placed on the sidewall 124. The substrate holder 112 in the plasma processing system 200 comprises a conductive pedestal 119 with the sides of the pedestal 119 covered by an optional dielectric structure 116, similar to pedestal 118 described above with reference to FIG. 1A. However, unlike pedestal 118, the top surface of pedestal 119 is not a major surface of the EM metasurface of the respective plasma processing system 200. In the plasma processing system 200, the EM metasurface 234 is buried in the dielectric window 126, and the major surface 230 is the side facing downward toward the substrate holder 112. For stronger coupling with plasma 106, it is preferred that the EM metasurface 234 be positioned close to the side of the dielectric window 126 that faces the chamber cavity 102, leaving a relatively thin solid dielectric layer that functions as the separator 122, described above with reference to FIG. 1A. Being enclosed by a solid dielectric of the dielectric window 126, the major surface 230 is sealed from the gases in the chamber cavity 102.

Figure 2B:
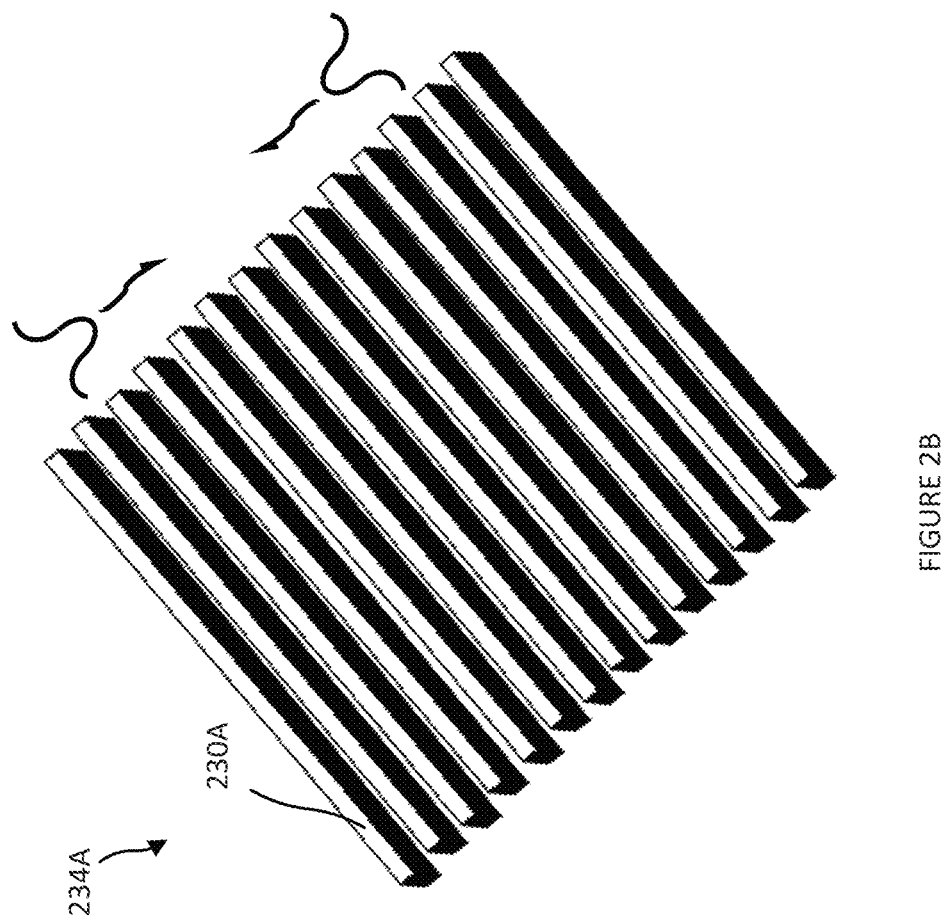
FIG. 2B is a perspective view of an EM metasurface, in accordance with an embodiment.
Figure 2C:
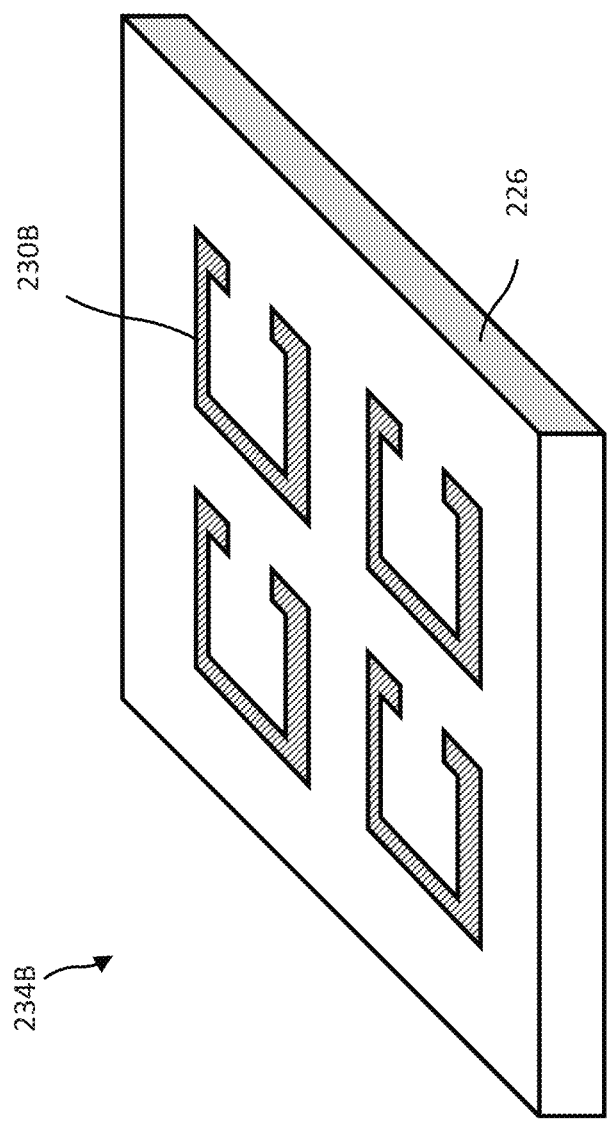
FIG. 2C is a perspective view of an EM metasurface, in accordance with an embodiment.
Figure 2D:
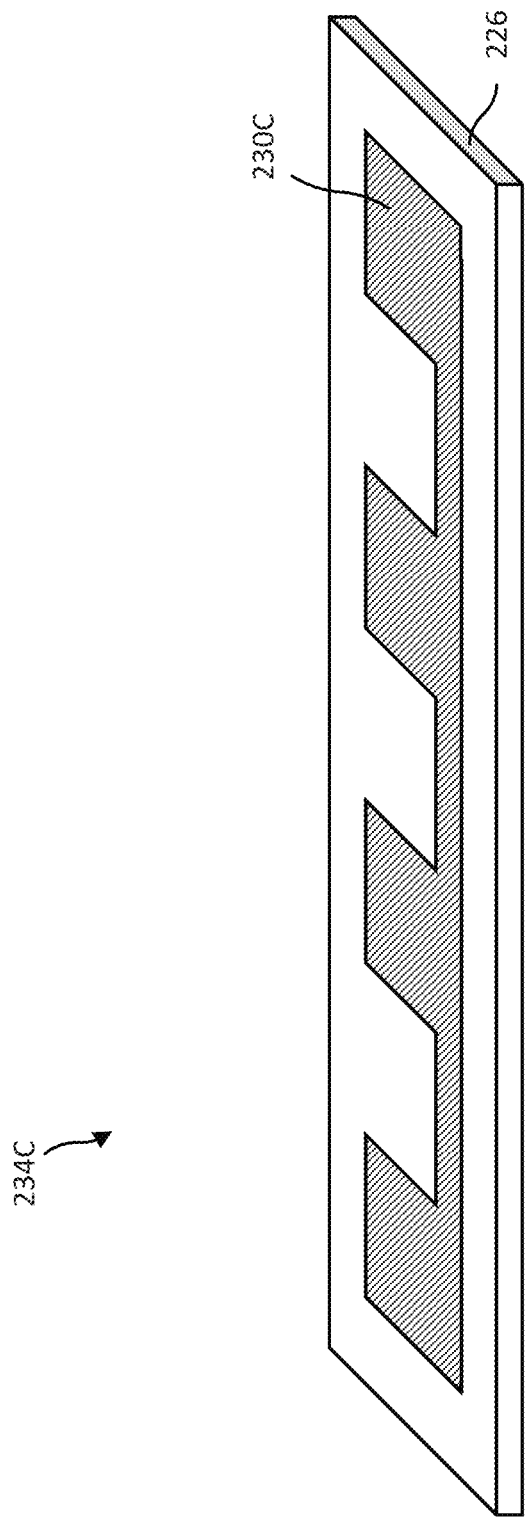
FIG. 2D is a perspective view of an EM metasurface, in accordance with an embodiment.

FIGS. 2B-2D illustrate perspective views of three example major surfaces of EM metasurfaces 234A, 234B, and 234C suitable for the plasma processing system 200, illustrated in FIG. 2A. FIG. 2B illustrates a major surface 230A comprising openings formed in a conductor, and FIGS. 2C and 2D illustrate two example designs of major surfaces 230B and 230C using microstrip metamaterials. Because of the location of the EM metasurface 234 in the plasma processing system 200 (as illustrated in FIG. 2A), the EM fields generated by the RF source electrode 108 would be partially shielded by the conductive regions of the EM metasurface 234 structure. Accordingly, the patterns selected for the major surfaces 230A, 230B and 230C do not include a conductive plate. If the major surface 230 in FIG. 2A were to include a conductive plate then the RF source power may be practically blocked from igniting plasma in the chamber cavity 102.

The major surface 230A, shown in FIG. 2B, is another example EM metasurface designed as an array of openings in a conductive matrix, similar to the major surfaces 130A and 130B described above with reference to FIGS. 1B and 1C. As illustrated in FIG. 2B, the openings extend through the conductor to eliminate the flat bottom wall present in the trench-shaped openings of major surface 130A. Eliminating the bottom wall allows the EM fields originating from the RF source electrode 108 (illustrated in FIG. 2A) to couple to plasma 106 in chamber cavity 102. Likewise, other embodiments, similar to the rectangular array of prism-shaped holes in major surface 130B in FIG. 1C, may be used in the plasma processing system 200 (see FIG. 2A) after modifying the design by extending the holes through the conductive matrix to form perforations. There is no dielectric separator shown in 2B because, as mentioned above, the EM metasurface 234 in plasma processing system 200 would be buried in the solid dielectric material of the dielectric window 126; hence, a separator is unnecessary to seal the major surface 230A from the chamber cavity 102.

FIGS. 2C and 2D illustrate examples of EM metasurfaces 234B and 234C using microstrip metamaterials, which may be suitable for the plasma processing system 200. These structures comprise a planar repetitive arrangement of a pattern of metal in a dielectric matrix 226, similar to microstrip antennas printed in a printed circuit board (PCB) or a monolithic microwave integrated circuit (MMIC) used for telecommunications at microwave frequencies. The dielectric in a microstrip metamaterial may comprise quartz, glass, a ceramic, silicon, etc., and the conductor may comprise a metal, such as copper, tungsten, brass, silver, gold and the like. The major surfaces 230B and 230C of the EM metasurfaces 234B and 234C comprise arrays of microstrips, where a microstrip is a 2D pattern of conductive material buried inside a dielectric matrix 226. For the plasma processing system 200, the dielectric matrix 226 may be, for example, the solid dielectric layer of the dielectric window 126. While a microstrip antenna array used in a microwave circuit generally has a conductive sheet in a plane below the plane of the array of patterned conductors that may be used as a ground plane, it is noted that there is no such conductive sheet in the EM metasurface 234 since the EM metasurface 234 may be placed in the dielectric window 126 disposed in the region between the RF source electrode 108 and the chamber cavity 102 of the plasma processing system 200, as illustrated in FIG. 2A.

Referring to FIG. 2C, the major surface 230B comprises a rectangular array of microstrips having a two-dimensional pattern referred to as a split ring resonator. The split ring resonator is shaped like an incomplete rectangular ring having a break in one side of the ring, as illustrated in FIG. 2C. Referring now to FIG. 2D, the microstrip pattern used for the major surface 230C is shaped like a comb, where each tooth of the comb is shaped like a rectangle. The microstrip patterns used in the major surfaces 230B and 230C are by example only. It is understood that various other microstrip patterns may be used in various embodiments.

Figure 3:
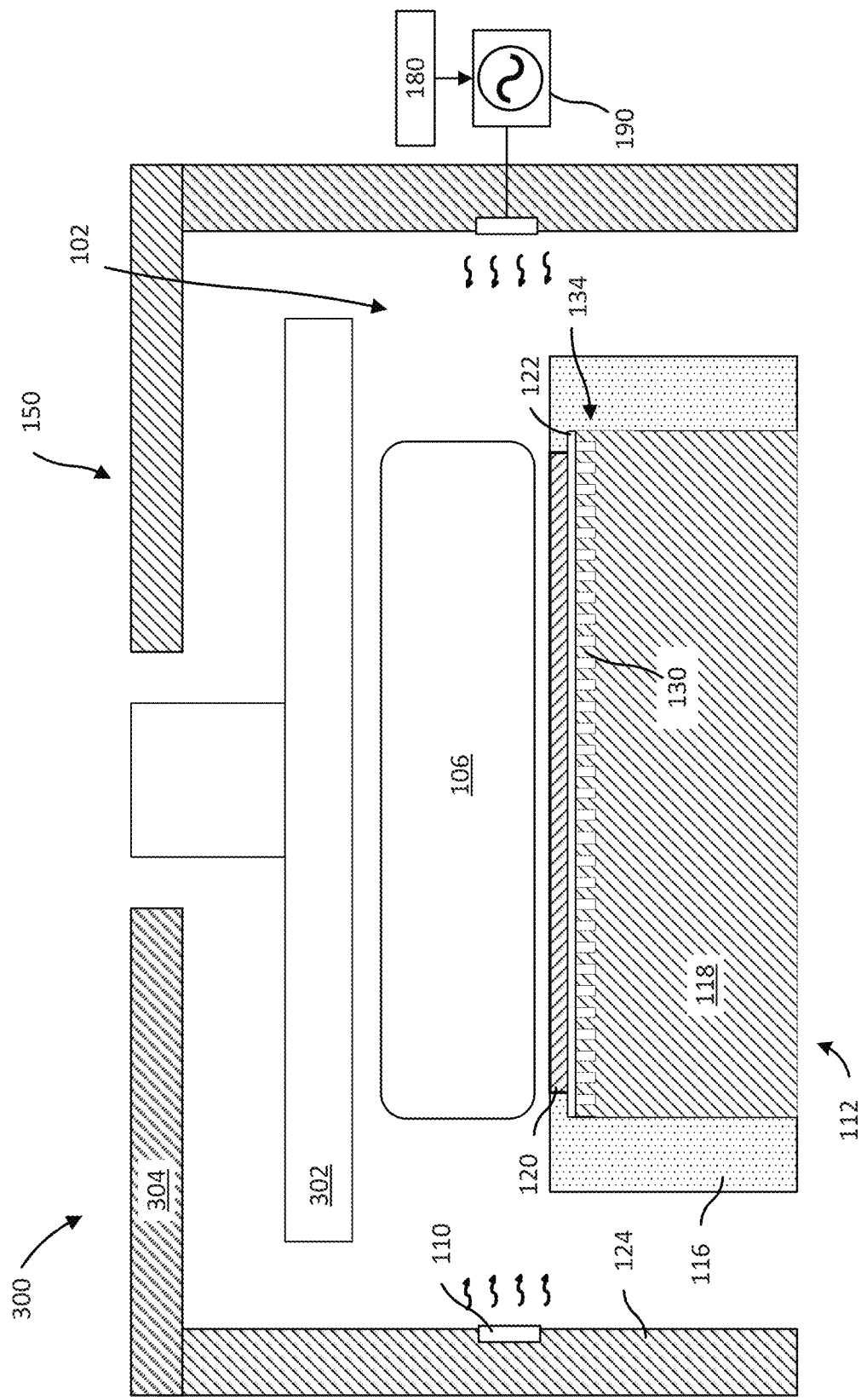
FIG. 3 is a cross-sectional view of a capacitively coupled plasma (CCP) processing chamber with an electromagnetic (EM) metasurface in a substrate holder of the CCP chamber, in accordance with an embodiment.
Figure 4:
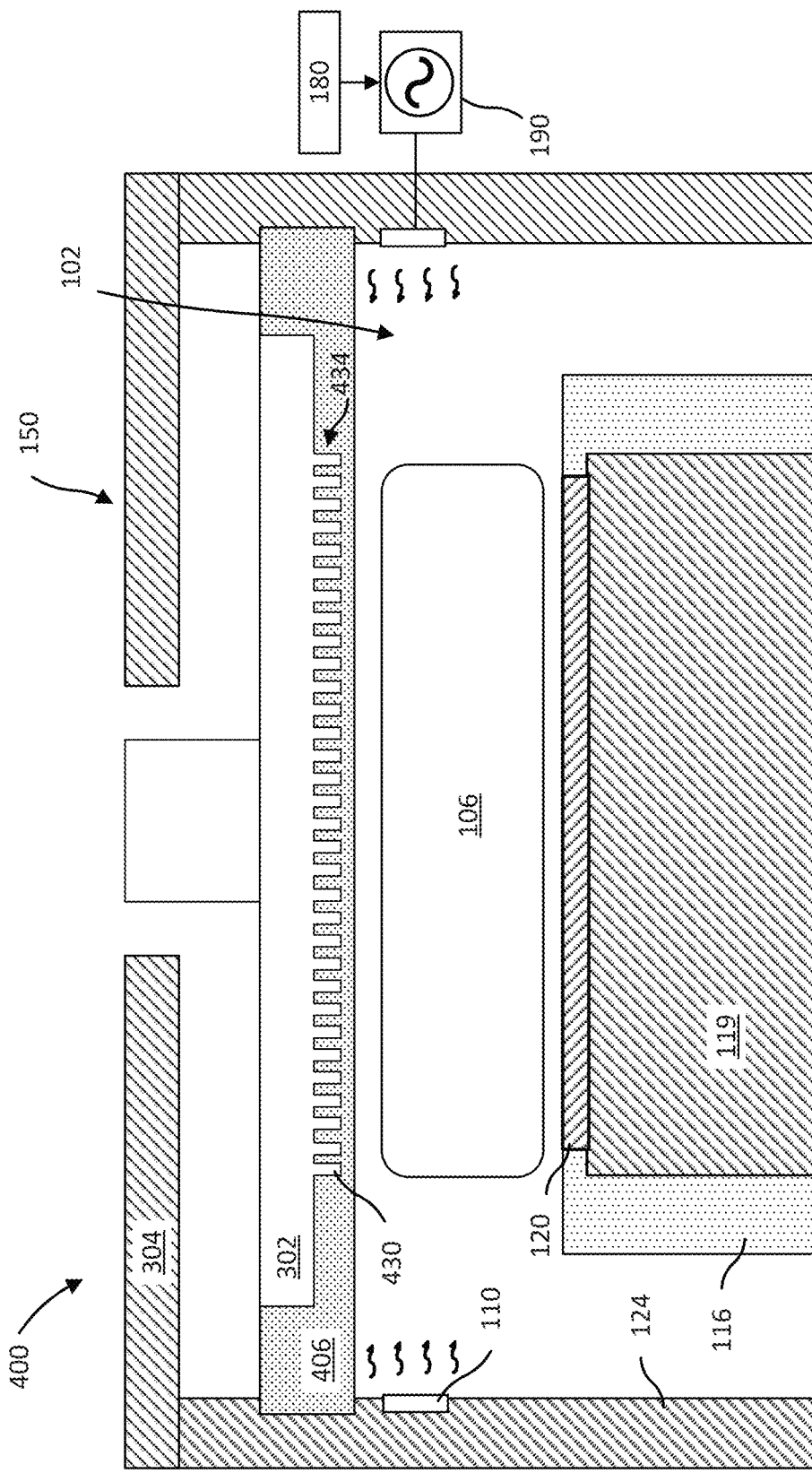
FIG. 4 is a cross-sectional view of a CCP processing chamber with an EM metasurface in a top electrode of the CCP chamber, in accordance with an embodiment.
Figure 5:
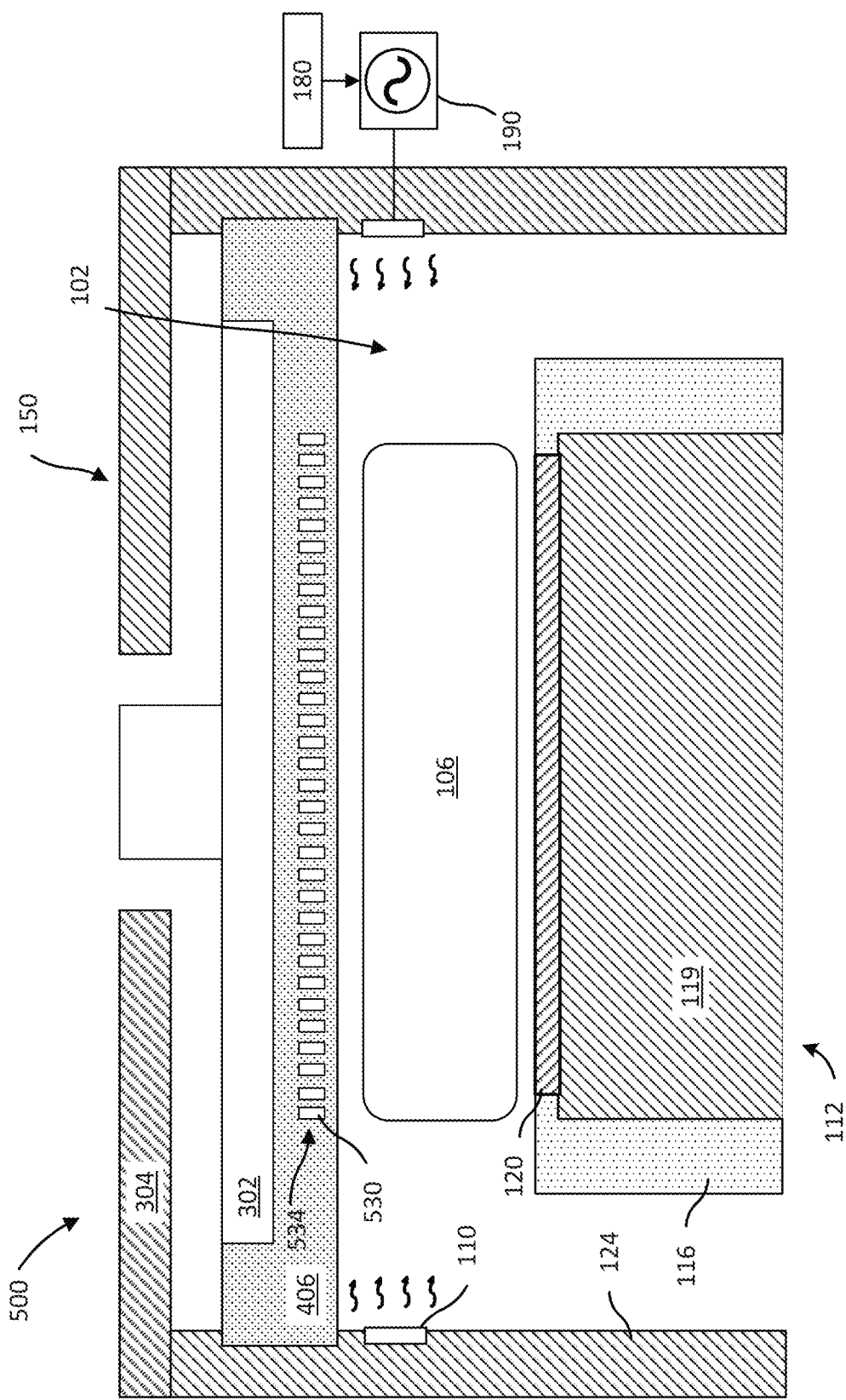
FIG. 5 is a cross-sectional view of a CCP processing chamber with an EM metasurface below a top electrode of the CCP chamber, in accordance with an embodiment.

FIGS. 3, 4, and 5 illustrate embodiments of plasma processing systems 300, 400, and 500, respectively that use radio frequency (RF) power supplemented with microwave power coupled to plasma 106 in a plasma processing chamber 150, similar to the plasma processing systems 100 and 200, described above with reference to FIGS. 1A and 2A. However, plasma processing systems 300, 400, and 500 differ from the plasma processing systems 100 and 200 in the configuration used for their respective plasma processing chambers 150. Plasma processing chambers 150 of plasma processing systems 300, 400, and 500 are configured as capacitively coupled plasma (CCP) chambers, whereas the plasma processing chambers 150 of the plasma processing systems 100 and 200 are configured as ICP chambers. Generally, in the CCP configuration, the RF source electrode has a substantially flat conductive surface and is disposed in the plasma processing chamber 150. However, as described below, in some embodiments, the conductive surface of the RF source electrode comprises the major surface of the EM metasurface used in the respective plasma processing system. As mentioned above with reference to FIGS. 1B, 1C, and 2B, the major surface may be a corrugated surface or a perforated surface comprising a pattern of openings in a conductor. Accordingly, in some embodiments, the surface of the RF source electrode may not be flat if, for example, the surface comprises the corrugated major surface of the EM metasurface. In some other embodiments, the conductive surface of the RF source electrode may be a smooth surface, similar to a plate of a parallel plate capacitor.

As illustrated in FIGS. 3-5, the plasma processing systems 300, 400, and 500 comprise a top electrode 302, shaped like a conductive plate. A central portion of the top electrode 302 may be extending through an opening in a top cover 304 of the plasma processing chamber 150. The opening may be part of a showerhead assembly used to flow gases into the chamber cavity 102. Gases may also be introduced into the chamber cavity 102 through gas inlets in the sidewall 124. In addition to the top electrode 302, a conductive portion of the substrate holder 112, for example, the conductive pedestal 118 in FIG. 3 and the conductive pedestal 119 in FIGS. 4 and 5, may be configured as a bottom electrode. In a CCP configuration, either the top electrode 302 or the bottom electrode (e.g., the pedestals 118 and 119) may be configured as the RF source electrode. In contrast, in the ICP configuration, the RF source is outside the plasma processing chamber 150, generally shaped like an RF coil, as illustrated in the cross-sectional views in FIGS. 1A and 2A. In some embodiments, the top electrode 302 in a CCP chamber may be configured to function as the RF source electrode and the pedestal 118 (or pedestal 119) may be configured to function as an RF bias electrode, a DC bias electrode, or ground connection, or a combination of a DC bias electrode and RF bias electrode. In some other embodiments, the plasma processing chambers 150 in FIGS. 3-5 may have a CCP chamber configuration with the functions of the two electrodes reversed.

As illustrated in FIGS. 3-5, the microwave source may be the microwave antennas no placed on the sidewall 124 of the plasma processing chamber 150, similar to the microwave antennas no in the plasma processing systems 100 and 200 described above with reference to FIGS. 1A and 2A. Microwave radiation emitted from the microwave antennas no may be coupled to the EM metasurface 134, 434, and 534 at the edges of the major surfaces 130, 430, and 530 in the plasma processing systems 300, 400, and 500, respectively, as illustrated in FIGS. 3, 4, and 5. As explained above, microwave radiation at or near the resonant frequencies of the EM metasurfaces 134, 434, and 534 may excite respective SSPP modes by which microwave power may be propagated from the edges toward a central region of the major surfaces 130, 430, and 530.

FIG. 3 illustrates a cross-sectional view of the plasma processing system 300, where the EM metasurface 134 is the conductive pedestal 118. Pedestal 118 in substrate holder 112 of the plasma processing system 300 is similar to the pedestal 118 of the plasma processing system 100, described above with reference to FIGS. 1A-1 C. The top conductive surface of the pedestal 118 is the major surface 130 of the EM metasurface 134.

FIG. 4 illustrates a cross-sectional view of the plasma processing system 400, where the EM metasurface 434 is a bottom region of the top electrode 302, the bottom surface of which comprises the major surface 430 of the EM metasurface 434. In the example embodiment illustrated in FIG. 4, the EM metasurface 434 and the top electrode 302 form one monolithic structure. However, it is understood that separate structures assembled together are also possible. The major surface 430 (in the top electrode 302 in FIG. 4) is similar to the major surface 130 in the bottom electrode (pedestal 118) of the plasma processing system 300 (described above with reference to FIG. 3). As illustrated in FIG. 4, the monolithic EM metasurface 434 and top electrode 302 has been embedded in a solid dielectric overlayer 406. Accordingly, in this example embodiment, the major surface 430 of the EM metasurface 434 is sealed from the chamber cavity 102 by the solid dielectric overlayer 406 without providing a solid dielectric separator, such as the separator 122 in FIG. 3. It is noted that, for the plasma processing system 300, the separator 122 is a part of the top surface of the substrate holder 112 over which the semiconductor wafer 120 may be placed, as illustrated in FIG. 3. In contrast, in the plasma processing system 400, the semiconductor wafer 120 may be placed over the top surface of the conductive pedestal 119. However, as known to a person skilled in the art, in some embodiments, the substrate holder 112 may be an electrostatic chuck comprising a dielectric top surface over the conductive pedestal 119.

The dielectric overlayer 406 in FIG. 4 is shown to extend across the chamber like a second ceiling, leaving some space between the dielectric overlayer and the top cover 304. However, it is understood that the dielectric overlayer may have various other shapes in various embodiments. For example, the lateral extent of the dielectric overlayer may be smaller and leave a gap between the top electrode 302 and the sidewall 124. In another embodiment, the top of the dielectric overlayer may extend further upwards and even be adjacent below the top cover 304.

FIG. 5 illustrates another example plasma processing system 500 where, similar to the plasma processing system 400, the EM metasurface 534 is disposed buried in a dielectric overlayer 406 above the plasma 106 in a plasma processing chamber 150 configured as a CCP chamber. Instead of using a monolithic structure comprising the EM metasurface and the top electrode 302, the EM metasurface 534 is disposed below the top electrode with the major surface 530 of the EM metasurface 534 facing the substrate holder 112. As illustrated in FIG. 5, the major surface 530 of the EM metasurface 534 and the bottom surface of the top electrode 302 are buried in the dielectric overlayer 406. The major surface 530 is similar to the major surface 230 of plasma processing system 200, illustrated in FIGS. 2A-2D. In FIG. 5, the major surface 530 comprises openings extending through a conductive matrix, similar to the example major surface 230A described with reference to FIG. 2B. However, similar to the major surface 230, the major surface 530 of the EM metasurface 534 of the plasma processing system 500 may also comprise a 2D arrangement of microstrips such as the example major surfaces 230B and 230C, described with reference to FIGS. 2C and 2D.

The dielectric of the dielectric overlayer 406 is filling the gaps between the conductive top electrode 302 and the conductor pattern of the major surface 530 of the EM metasurface 534. However, it is understood that several variations of the example structure illustrated in FIG. 5 are possible in various embodiments. For example, the dielectric between the conductive features in the EM metasurface may comprise a gas (e.g., air) sealed from the chamber cavity 102 by the solid dielectric overlayer 406 and the conductive top electrode 302.

Figure 6:
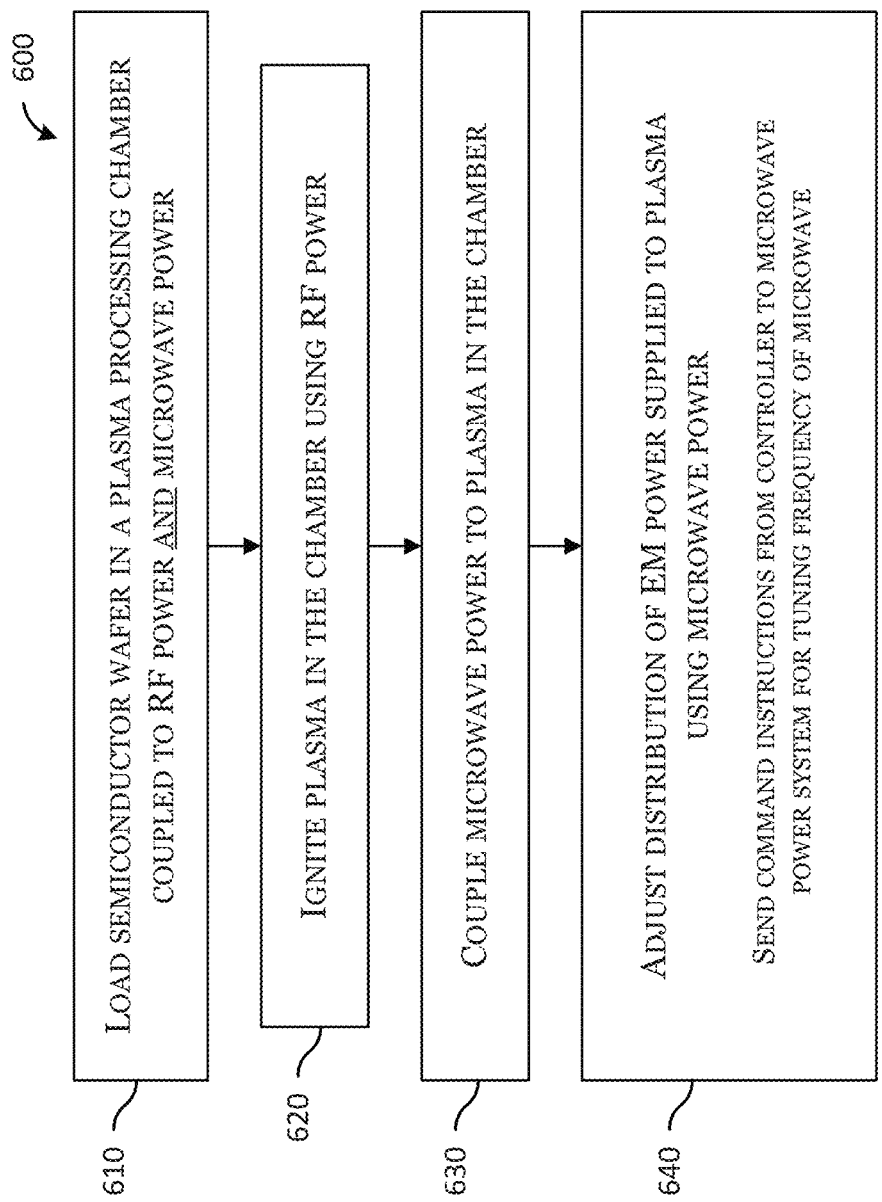
FIG. 6 is a flow diagram illustrating a method for plasma processing of a semiconductor wafer using radio frequency (RF) power and microwave power, in accordance with an embodiment.

FIG. 6 is a flow diagram illustrating a method 600 for processing a semiconductor wafer by performing a plasma process using a plasma processing system such as the example embodiments of plasma processing systems 100, 200, 300, 400, and 500, described above with reference to FIGS. 1A-5. In these plasma processing systems, microwave power supplements RF power to provide several advantages mentioned above, such as the advantage of achieving more uniform plasma and, hence, more spatially uniform characteristics for the processed semiconductor wafer. The method 600 for plasma processing is described below referring to FIGS. 1A-6.

The semiconductor wafer 120 may be loaded on the substrate holder 112 in the chamber cavity 102 of the plasma processing chamber 150, as indicated in box 610 in FIG. 6. An RF power source may be coupled to an RF source electrode to provide RF power to the plasma processing chamber 150 using a suitable configuration. For example, in an ICP configuration (FIGS. 1A and 2A), an RF coil may be used as the RF source electrode 108, whereas in a CCP configuration (FIGS. 3-5), the top electrode 302 or the bottom electrode (pedestals 118 and 119) may be used as the RF source electrode. A gaseous mixture of process and carrier gases may be flown at specified flow rates through the chamber cavity 102, and the gaseous mixture may be maintained, for example, at a low pressure controlled by a vacuum system coupled to the chamber cavity 102. The RF power from the RF source electrode may be coupled to the gaseous mixture to ignite and sustain plasma 106 in the chamber cavity 102, as indicated in box 620 in FIG. 6. In addition to RF power, microwave power may be coupled to plasma 106, as indicated in box 630 in FIG. 6. Microwave antennas no placed on the sidewalls 124 of the plasma processing chamber 150 may be the microwave source when coupled to a microwave oscillator 190. Coupling the microwave oscillator 190 to the microwave antennas no may radiate microwaves into the chamber cavity 102. The microwave power radiated from the microwave antennas 110 may be less than the RF power radiated by the RF source electrode. In various embodiments the microwave power radiated by the microwave antennas no may be between 10% and 50% of the combined EM power supplied to the RF source electrode and the microwave antennas. The frequency of the microwave oscillator 190 may be selected to be at or near a resonant frequency of the repetitive pattern in the major surface of the EM metasurface (e.g., the major surface 130, 230, 430, or 530) of the respective plasma processing system. As explained above, microwave radiation at or near a resonant frequency of the repetitive pattern in the major surface of the EM metasurface may excite respective SSPP modes at the edges of the major surfaces. These surface EM excitations may propagate EM power from the edges to the central region of the major surface.

The surface microwave SSPP excitation results in an evanescent electric field within the plasma sheath. Accordingly, exciting the surface EM waves comprises coupling the microwave power radiated from the antennas 110 to the plasma 106. The spatial distribution of the RF power and the microwave power may be complementary. Plasma powered by EM radiation at the higher microwave frequency (e.g., 2.45 GHz) may result in high density plasma, which has a radial distribution that is different from plasma sustained from the much lower RF frequency (e.g., 13.56 MHz and 27.15 MHz). For example, without the microwave source the plasma power density may be higher near the edge of the semiconductor wafer 120 relative to the center, indicating that there is a stronger coupling of RF power to plasma nearer the edge. The microwave power may couple more strongly closer to the center region; hence, a more uniform plasma power density may be achieved with the supplemental microwave power. Furthermore, the spatial distribution depends on various other plasma process parameters, such as chamber pressure and the plasma species. Because of these reasons, it is advantageous to adjust the spatial distribution of EM power to improve process uniformity and process control.

The spatial distribution of combined EM power coupled to the plasma 106 may be controllably adjusted using the method 600, as described below with reference to box 640. In the plasma processing systems described in this disclosure, instructions maybe sent from a controller 180 outside the chamber cavity 102 to the microwave power system to adjust the frequency of microwave radiation emitted by the antennas no by adjusting the frequency of a microwave oscillator 190 coupled to the antennas 110. As explained in further detail below, this adjustment may be utilized to adjust the spatial uniformity metric of EM power supplied to the plasma, e.g., a spatially localized magnitude of the EM power that is powering the plasma.

The microwave power delivered to the plasma processing chamber 150 may be less than the RF power delivered by the RF source electrode. In various embodiments the microwave power may be between 10% and 50% of the combined EM power supplied to the RF source electrode and the microwave source. If the microwave power is too small a fraction of the total EM power then it may not be effective in adjusting the spatial distribution of the total EM power coupled to the plasma 106. On the other hand, for a fixed total EM power specified for plasma processing, if the microwave power becomes the dominant source of EM power then the respective RF power may be insufficient to ignite and sustain the plasma 106, whereas, in the embodiments described in this disclosure, it is the RF power that is being used to ignite and sustain the plasma 106.

As indicated in box 640 in FIG. 6, microwave power may be used to adjust the distribution of the combined EM power supplied to plasma 106. The microwave power coupled to the SSPP excitations depends on the frequency of the EM radiation impinging on the major surface of the EM metasurface. The coupling would be strongest at the resonant frequency of the pattern on the major surface, reducing rapidly with frequency in a narrow band around the resonant frequency. Furthermore, the attenuation of the excitations with distance depends on frequency. Thus, adjusting the spatial distribution of EM power may comprise tuning a frequency of the microwave oscillator 190, the frequency of the microwave radiation being same as the frequency of the signal from the microwave oscillator 190. Accordingly, using a tunable microwave oscillator 190 where the frequency of the microwave oscillation may be controlled with instructions sent to the microwave power system from outside the chamber cavity 102 provides the plasma processing system the advantage of controlling the spatial distribution; hence adjust the spatial uniformity metric of EM power in order to achieve a more spatially uniform distribution of EM power coupled to the plasma.

The microwave frequency may be selected using a tuner configured to adjust the frequency of the microwave oscillator 190 in accordance with command instructions received from a controller 180 in the plasma processing systems 100, 200, 300, 400, and 500. The controller 180 may be configured to execute instructions, for example, instructions coded in a process recipe directing the controller 180 to send command instructions to the microwave power system for the tuner to select a desired frequency to adjust the distribution of EM power supplied to plasma.

The embodiments of plasma processing systems described in this disclosure provide the advantages of achieving more uniform plasma and of having a plasma control parameter that may be used to adjust the distribution of EM power.

Example embodiments discussed in this application are summarized here. Other embodiments can also be understood from the entirety of the specification as well as the claims filed herein.

Example 1. A plasma processing system including: a vacuum system; a plasma processing chamber (e.g., iso) including: a chamber cavity (e.g., 102) coupled to the vacuum system; and a substrate holder (e.g., 112) including a surface inside the chamber cavity (e.g., 102); a radio frequency (RF) source electrode (e.g., 108) coupled to an RF power source, the RF source electrode (e.g., 108) configured to ignite plasma (e.g., 106) in the chamber cavity (e.g., 102); a microwave source (e.g., 110) coupled to a microwave oscillator (e.g., 190); and an electromagnetic (EM) metasurface (e.g., 134, 234, 334, 434, 534), the EM metasurface having a major surface (e.g., 130, 230, 430, or 530) electromagnetically coupled to the microwave source, the major surface (e.g., 130, 230, 430, or 530) configured to couple microwave power to the plasma (e.g., 106) in the chamber cavity (e.g., 102).

Example 2. The system of example 1, further including a tuner configured to adjust a frequency of the microwave oscillator, where the microwave source includes a microwave antenna (e.g., 110).

Example 3. The system of one of examples 1 or 2, where the substrate holder includes an electrically conductive pedestal (e.g., 118, 119), a portion of the pedestal including the EM metasurface with the major surface of the EM metasurface facing the chamber cavity, the EM metasurface being isolated from ambient conditions in the chamber cavity by a separator including a solid dielectric layer disposed between the major surface of the EM metasurface and the chamber cavity.

Example 4. The system of one of examples 1 to 3, where the EM metasurface includes a conductor, the major surface of the EM metasurface including a two-dimensional (2D) pattern of openings, the openings including an insulator.

Example 5. The system of one of examples 1 to 4, where the openings have a conductive bottom wall located at a depth, the depth being a distance of the conductive bottom wall from the top of the opening.

Example 6. The system of one of examples 1 to 5, where the openings extend through the conductor.

Example 7. The system of one of examples 1 to 6, where the 2D pattern of openings is an array of openings, the openings being shaped like lines, where the lines have a length dimension greater than a width dimension.

Example 8. The system of one of examples 1 to 7, where the 2D pattern of openings is an array of openings, the openings being shaped like prisms, the prisms having lateral dimensions of roughly equal size.

Example 9. The system of one of examples 1 to 8, where the EM metasurface includes a microstrip metamaterial, the major surface of the EM metasurface including a 2D arrangement of microstrips, each microstrip being a 2D pattern of conductive material embedded inside a solid dielectric layer.

Example 10. The system of one of examples 1 to 9, where the 2D pattern of conductive material of the microstrip is shaped like a comb, where each tooth of the comb is shaped like a rectangle.

Example 11. The system of one of examples 1 to 10, where the 2D pattern of conductive material of the microstrip is shaped like a split ring resonator, where the split ring resonator is shaped like an incomplete rectangular ring having a break in one side of the ring.

Example 12. The system of one of examples 1 to 11, where the plasma processing chamber is an inductively coupled plasma (ICP) chamber, a portion of the ICP chamber including a solid dielectric window being disposed opposite of the substrate holder; where the RF source electrode is an RF coil disposed outside the plasma processing chamber adjacent to the solid dielectric window; and where the EM metasurface is buried in the solid dielectric window with the major surface of the EM metasurface being opposite the substrate holder.

Example 13. The system of one of examples 1 to 12, where the plasma processing chamber is a capacitively coupled plasma (CCP) chamber having an electrode shaped like a plate and disposed opposite of the substrate holder; and where the EM metasurface is disposed below the electrode with the major surface of the EM metasurface being opposite the substrate holder, the major surface of the EM metasurface and the bottom surface of the electrode being buried in a dielectric overlayer.

Example 14. The system of one of examples 1 to 13, where the plasma processing chamber is a capacitively coupled plasma (CCP) chamber having an electrode shaped like a plate, the electrode including a surface disposed inside the CCP chamber opposite of the substrate holder; and where a region of the electrode includes the EM metasurface, the surface of the electrode including the major surface of the EM metasurface, the major surface of the EM metasurface being embedded in a solid dielectric overlayer.

Example 15. A plasma processing system including: a plasma processing chamber; a radio frequency (RF) source electrode coupled to an RF power source, the RF source electrode configured to ignite plasma in the plasma processing chamber; a microwave power system coupled to the plasma with microwave power, the microwave power system including: an electromagnetic (EM) metasurface having a major surface configured to couple microwave power to the plasma in the plasma processing chamber; a microwave source coupled to a microwave oscillator; and a controller configured to execute instructions to adjust a spatial uniformity metric of EM power supplied to the plasma.

Example 16. The system of example 15, further including a tuner configured to adjust a frequency of the microwave oscillator, the tuner configured to receive command instructions to adjust the frequency from the controller, and where the microwave source includes a microwave antenna.

Example 17. A method for plasma processing of a semiconductor wafer, the method including: loading the semiconductor wafer in a plasma processing chamber coupled to a radio frequency (RF) source electrode and a microwave power system including a microwave oscillator and a microwave source; igniting plasma by coupling RF power from the RF source electrode to gas in the plasma processing chamber; coupling microwave power from the microwave power system to a plasma ignited in the plasma processing chamber by coupling the microwave oscillator to the microwave source; and adjusting the microwave power to control a spatial uniformity metric of a combined electromagnetic (EM) power being supplied to the plasma.

Example 18. The method of example 17, where coupling the microwave oscillator to the microwave source includes providing microwave power between 10% and 50% of the combined EM power supplied to the RF source electrode and the microwave source.

Example 19. The method of one of examples 17 or 18, where adjusting the spatial uniformity metric of the EM power includes: sending command instructions from a controller to the microwave power system for tuning a frequency of the microwave oscillator, where the microwave source includes a microwave antenna.

Example 20. The method of one of examples 17 to 19, further including: exciting, with the microwave source, surface EM waves on a major surface of an EM metasurface, the microwave power system further including the EM metasurface.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A plasma processing system comprising:
    a vacuum system;
    a plasma processing chamber comprising:
        a chamber cavity coupled to the vacuum system; and
        a substrate holder comprising a surface inside the chamber cavity;
    a radio frequency (RF) source electrode coupled to an RF power source, the RF source electrode configured to ignite plasma in the chamber cavity;
    a microwave source coupled to a microwave oscillator; and
    an electromagnetic (EM) metasurface, the EM metasurface having a major surface electromagnetically coupled to the microwave source, the major surface configured to couple microwave power to the plasma in the chamber cavity.

2. The system of claim 1, further comprising a tuner configured to adjust a frequency of the microwave oscillator, wherein the microwave source comprises a microwave antenna.

3. The system of claim 1,
    wherein the substrate holder comprises an electrically conductive pedestal, a portion of the pedestal comprising the EM metasurface with the major surface of the EM metasurface facing the chamber cavity, the EM metasurface being isolated from ambient conditions in the chamber cavity by a separator comprising a solid dielectric layer disposed between the major surface of the EM metasurface and the chamber cavity.

4. The system of claim 1, wherein the EM metasurface comprises a conductor, the major surface of the EM metasurface comprising a two-dimensional (2D) pattern of openings, the openings comprising an insulator.

5. The system of claim 4, wherein the openings have a conductive bottom wall located at a depth, the depth being a distance of the conductive bottom wall from the top of the opening.

6. The system of claim 4, wherein the openings extend through the conductor.

7. The system of claim 4, wherein the 2D pattern of openings is an array of openings, the openings being shaped like lines, wherein the lines have a length dimension greater than a width dimension.

8. The system of claim 4, wherein the 2D pattern of openings is an array of openings, the openings being shaped like prisms, the prisms having lateral dimensions of roughly equal size.

9. The system of claim 1, wherein the EM metasurface comprises a microstrip metamaterial, the major surface of the EM metasurface comprising a 2D arrangement of microstrips, each microstrip being a 2D pattern of conductive material embedded inside a solid dielectric layer.

10. The system of claim 9, wherein the 2D pattern of conductive material of the microstrip is shaped like a comb, wherein each tooth of the comb is shaped like a rectangle.

11. The system of claim 9, wherein the 2D pattern of conductive material of the microstrip is shaped like a split ring resonator, wherein the split ring resonator is shaped like an incomplete rectangular ring having a break in one side of the ring.

12. The system of claim 1,
wherein the plasma processing chamber is an inductively coupled plasma (ICP) chamber, a portion of the ICP chamber comprising a solid dielectric window being disposed opposite of the substrate holder;
wherein the RF source electrode is an RF coil disposed outside the plasma processing chamber adjacent to the solid dielectric window; and
wherein the EM metasurface is buried in the solid dielectric window with the major surface of the EM metasurface being opposite the substrate holder.

13. The system of claim 1,
wherein the plasma processing chamber is a capacitively coupled plasma (CCP) chamber having an electrode shaped like a plate and disposed opposite of the substrate holder; and
wherein the EM metasurface is disposed below the electrode with the major surface of the EM metasurface being opposite the substrate holder, the major surface of the EM metasurface and the bottom surface of the electrode being buried in a dielectric overlayer.

14. The system of claim 1,
wherein the plasma processing chamber is a capacitively coupled plasma (CCP) chamber having an electrode shaped like a plate, the electrode comprising a surface disposed inside the CCP chamber opposite of the substrate holder; and
wherein a region of the electrode comprises the EM metasurface, the surface of the electrode comprising the major surface of the EM metasurface, the major surface of the EM metasurface being embedded in a solid dielectric overlayer.

15. A plasma processing system comprising:
a plasma processing chamber;
a radio frequency (RF) source electrode coupled to an RF power source, the RF source electrode configured to ignite plasma in the plasma processing chamber;
a microwave power system coupled to the plasma with microwave power, the microwave power system comprising:
an electromagnetic (EM) metasurface having a major surface configured to couple microwave power to the plasma in the plasma processing chamber;
a microwave source coupled to a microwave oscillator; and
a controller configured to execute instructions to adjust a spatial uniformity metric of EM power supplied to the plasma.

16. The system of claim 15, further comprising a tuner configured to adjust a frequency of the microwave oscillator, the tuner configured to receive command instructions to adjust the frequency from the controller, and wherein the microwave source comprises a microwave antenna.

17. A method for plasma processing of a semiconductor wafer, the method comprising:
loading the semiconductor wafer in a plasma processing chamber coupled to a radio frequency (RF) source electrode and a microwave power system comprising a microwave oscillator and a microwave source;
igniting plasma by coupling RF power from the RF source electrode to gas in the plasma processing chamber;
coupling microwave power from the microwave power system to the plasma ignited in the plasma processing chamber by coupling the microwave oscillator to the microwave source; and
adjusting the microwave power to control a spatial uniformity metric of a combined electromagnetic (EM) power being supplied to the plasma.

18. The method of claim 17, wherein coupling the microwave oscillator to the microwave source comprises providing microwave power between 10% and 50% of the combined EM power supplied to the RF source electrode and the microwave source.

19. The method of claim 17, wherein adjusting the spatial uniformity metric of the EM power comprises:
sending command instructions from a controller to the microwave power system for tuning a frequency of the microwave oscillator, wherein the microwave source comprises a microwave antenna.

20. The method of claim 17, further comprising:
exciting, with the microwave source, surface EM waves on a major surface of an EM metasurface, the microwave power system further comprising the EM metasurface.

21. The system of claim 1, wherein the microwave source is configured to excite surface EM waves on a major surface of an EM metasurface.

22. The system of claim 15, wherein the microwave power system is configured to
excite, with the microwave source, surface EM waves on a major surface of an EM metasurface, the microwave power system further comprising the EM metasurface.

* * * * *